(12) United States Patent
Noel et al.

(10) Patent No.: US 9,064,693 B2
(45) Date of Patent: Jun. 23, 2015

(54) DEPOSITION OF THIN FILM DIELECTRICS AND LIGHT EMITTING NANO-LAYER STRUCTURES

(75) Inventors: Jean-Paul Noel, Ottawa (CA); Ming Li, Cupertino, CA (US)

(73) Assignee: Kirsteen Mgmt. Group LLC, Wilmington, DE (US)

( * ) Notice: Subject to any disclaimer, the term of this patent is extended or adjusted under 35 U.S.C. 154(b) by 364 days.

(21) Appl. No.: 13/581,281

(22) PCT Filed: Mar. 1, 2010

(86) PCT No.: PCT/CA2010/000287
§ 371 (c)(1),
(2), (4) Date: Aug. 24, 2012

(87) PCT Pub. No.: WO2011/106860
PCT Pub. Date: Sep. 9, 2011

(65) Prior Publication Data
US 2012/0322181 A1    Dec. 20, 2012

(51) Int. Cl.
*H01L 21/311* (2006.01)
*H01L 21/31* (2006.01)
(Continued)

(52) U.S. Cl.
CPC ...... *H01L 21/02164* (2013.01); *C23C 16/0218* (2013.01); *C23C 16/345* (2013.01);
(Continued)

(58) Field of Classification Search
USPC .................. 438/700, 763, 778; 257/E21.102, 257/E21.268, E21.279, E21.293
See application file for complete search history.

(56) References Cited

U.S. PATENT DOCUMENTS

| 4,326,007 A | 4/1982 | Williams |
|---|---|---|
| 5,248,890 A | 9/1993 | Luth |

(Continued)

FOREIGN PATENT DOCUMENTS

| EP | 1 134 799 A1 | 9/2001 |
|---|---|---|
| JP | 2003-253254 A | 9/2003 |

(Continued)

OTHER PUBLICATIONS

International Search Report mailed Apr. 12, 2007, in International Application No. PCT/CA2006/002132 filed Dec. 22, 2006, 2 pages.
(Continued)

*Primary Examiner* — Mohsen Ahmadi
(74) *Attorney, Agent, or Firm* — Christensen O'Connor Johnson Kindness PLLC

(57) ABSTRACT

Deposition of thin film dielectrics, and in particular for chemical vapor deposition of nano-layer structures comprising multiple layers of dielectrics, such as, silicon dioxide, silicon nitride, silicon oxynitride, and/or other silicon compatible dielectrics includes post-deposition surface treatment of deposited layers with a metal or semiconductor source gas, e.g., a silicon source gas. Deposition of silicon containing dielectrics comprises silane-based chemistry for deposition of doped or undoped dielectric layers, and surface treatment of deposited dielectric layers with silane. Surface treatment provides dielectric layers with improved layer-to-layer uniformity and lateral continuity, and substantially atomically flat dielectric layers suitable for multilayer structures for electroluminescent light emitting structures, e.g., active layers containing rare earth containing luminescent centers. Doped or undoped dielectric thin films or nano-layer dielectric structures may also be provided for other semiconductor devices.

21 Claims, 8 Drawing Sheets

(51) Int. Cl.
*H01L 21/02* (2006.01)
*C23C 16/02* (2006.01)
*C23C 16/34* (2006.01)
*C23C 16/40* (2006.01)
*C23C 16/56* (2006.01)
*H05B 33/10* (2006.01)

(52) U.S. Cl.
CPC ............. *C23C16/401* (2013.01); *C23C 16/56* (2013.01); *H01L 21/0217* (2013.01); *H01L 21/022* (2013.01); *H01L 21/02312* (2013.01); *H01L 21/02337* (2013.01); *H05B 33/10* (2013.01)

(56) References Cited

U.S. PATENT DOCUMENTS

| | | |
|---|---|---|
| 5,249,195 A | 9/1993 | Feldman |
| 5,381,434 A | 1/1995 | Bhat |
| 5,406,575 A | 4/1995 | Chelny |
| 5,517,039 A | 5/1996 | Holonyak, Jr. |
| 5,796,120 A | 8/1998 | Summers |
| 5,920,086 A | 7/1999 | MacFarlane |
| 6,242,761 B1 | 6/2001 | Fujimoto |
| 6,455,870 B1 | 9/2002 | Wang |
| 6,525,337 B1 | 2/2003 | Ugajin |
| 6,608,328 B2 | 8/2003 | Kuo |
| 6,713,127 B2 | 3/2004 | Subramony et al. ..... 427/255.37 |
| 6,756,289 B1 | 6/2004 | Nakagawa |
| 6,815,731 B2 | 11/2004 | Sato |
| 6,884,464 B2 | 4/2005 | Luo et al. ................. 427/255.29 |
| 6,898,215 B2 | 5/2005 | Naone |
| 7,081,664 B2 | 7/2006 | Hill |
| 7,098,414 B2 | 8/2006 | Caldwell |
| 7,122,842 B2 | 10/2006 | Hill |
| 7,173,277 B2 | 2/2007 | Tamura |
| 7,256,426 B2 | 8/2007 | Li |
| 7,259,055 B2 | 8/2007 | Li |
| 7,364,924 B2 | 4/2008 | Hsu |
| 7,465,669 B2 | 12/2008 | Iyer et al. ...................... 438/700 |
| 7,522,647 B2 | 4/2009 | Hatori |
| 7,569,862 B2 | 8/2009 | Johnson |
| 7,585,788 B2 | 9/2009 | Zhuang |
| 7,589,464 B2 | 9/2009 | Conley, Jr. |
| 7,592,618 B2 | 9/2009 | Khang |
| 7,651,953 B2 | 1/2010 | Todd et al. .................... 438/763 |
| 7,679,102 B2 | 3/2010 | Chik |
| 7,723,913 B2 | 5/2010 | Casasanta |
| 7,800,117 B2 | 9/2010 | Chik |
| 7,858,992 B2 | 12/2010 | Ueta |
| 7,888,686 B2 | 2/2011 | Chik |
| 7,923,925 B2 | 4/2011 | MacElwee |
| 8,089,080 B2 | 1/2012 | Calder et al. ...................... 257/89 |
| 8,093,604 B2 | 1/2012 | Chik et al. ...................... 257/89 |
| 8,232,611 B2 | 7/2012 | Miner et al. .................. 257/410 |
| 2001/0010449 A1 | 8/2001 | Chiu |
| 2002/0153522 A1 | 10/2002 | Park |
| 2004/0149353 A1 | 8/2004 | Hill |
| 2004/0151461 A1 | 8/2004 | Hill |
| 2004/0214362 A1 | 10/2004 | Hill |
| 2004/0252738 A1 | 12/2004 | Hill |
| 2005/0037232 A1 | 2/2005 | Tyan |
| 2005/0041434 A1 | 2/2005 | Yatsuda |
| 2005/0051777 A1 | 3/2005 | Hill |
| 2005/0088853 A1 | 4/2005 | Yatsuda |
| 2005/0199892 A1 | 9/2005 | Cho |
| 2005/0224813 A1 | 10/2005 | Liu |
| 2006/0024449 A1* | 2/2006 | Cho et al. ...................... 427/532 |
| 2006/0180816 A1 | 8/2006 | Li |
| 2007/0181898 A1 | 8/2007 | Chik et al. ...................... 257/99 |
| 2007/0181906 A1 | 8/2007 | Chik et al. ...................... 257/103 |
| 2008/0093608 A1 | 4/2008 | Chik et al. ...................... 257/89 |
| 2008/0246046 A1 | 10/2008 | Chik |
| 2009/0053528 A1* | 2/2009 | Okuya et al. .................. 428/421 |
| 2009/0128029 A1 | 5/2009 | Macelwee |
| 2010/0018460 A1 | 1/2010 | Singh et al. .................... 118/620 |
| 2010/0032687 A1 | 2/2010 | Calder et al. ...................... 257/79 |
| 2010/0032704 A1 | 2/2010 | Denbaars |
| 2010/0048030 A1 | 2/2010 | Balseanu et al. .............. 438/778 |

FOREIGN PATENT DOCUMENTS

| | | |
|---|---|---|
| JP | 2003-257671 A | 9/2003 |
| WO | 02/061815 A1 | 8/2002 |
| WO | 2004/025999 A1 | 3/2004 |
| WO | 2006/049449 A1 | 5/2006 |

OTHER PUBLICATIONS

International Search Report mailed Apr. 20, 2007, in International Application No. PCT/CA2006/002133 filed Dec. 22, 2006, 2 pages.

Chen, Y.Y., et al., "High Quality $Al_2O_3$ IPD With $NH_3$ Surface Nitridation," IEEE Electron Device Letters 24(8):503-505, Aug. 2003.

Chryssou, C.E., and C.W. Pitt, "$Er^{3}$+-Doped $Al_2O_3$ Thin Films by Plasma-Enhanced Chemical Vapor Deposition (PECVD) Exhibiting a 55-nm Optical Bandwidth," IEEE Journal of Quantum Electronics 34(2):282-285, Feb. 1988.

Hsu, C.T., et al., "Effects of Insulating Layers and Active Layer on ZnS:Tb, F Thin-Film Electroluminescent Devices," Japanese Journal of Applied Physics 32(5A)1:1983-1986, May 1993.

Rozo, C., et al., "Spectroscopic Study of Rare Earth Doped Nano-Crystalline Silicon in $SiO_2$ Films," Materials Research Society Symposium Proceedings, USA, 737:517-522, Jan. 1, 2003.

Sun, J.M., et al., "Bright Green Electroluminescence From $Tb^{3}$•in Silicon Metal-Oxide-Semiconductor Devices," Journal of Applied Physics 97(12), 2005,7 pages.

European Search Report mailed Mar. 2, 2011, in European Application No. 06840558, filed Dec. 22, 2006, 3 pages.

PCT Search Report for PCT/CA2010/000287, Nov. 20, 2010.

* cited by examiner

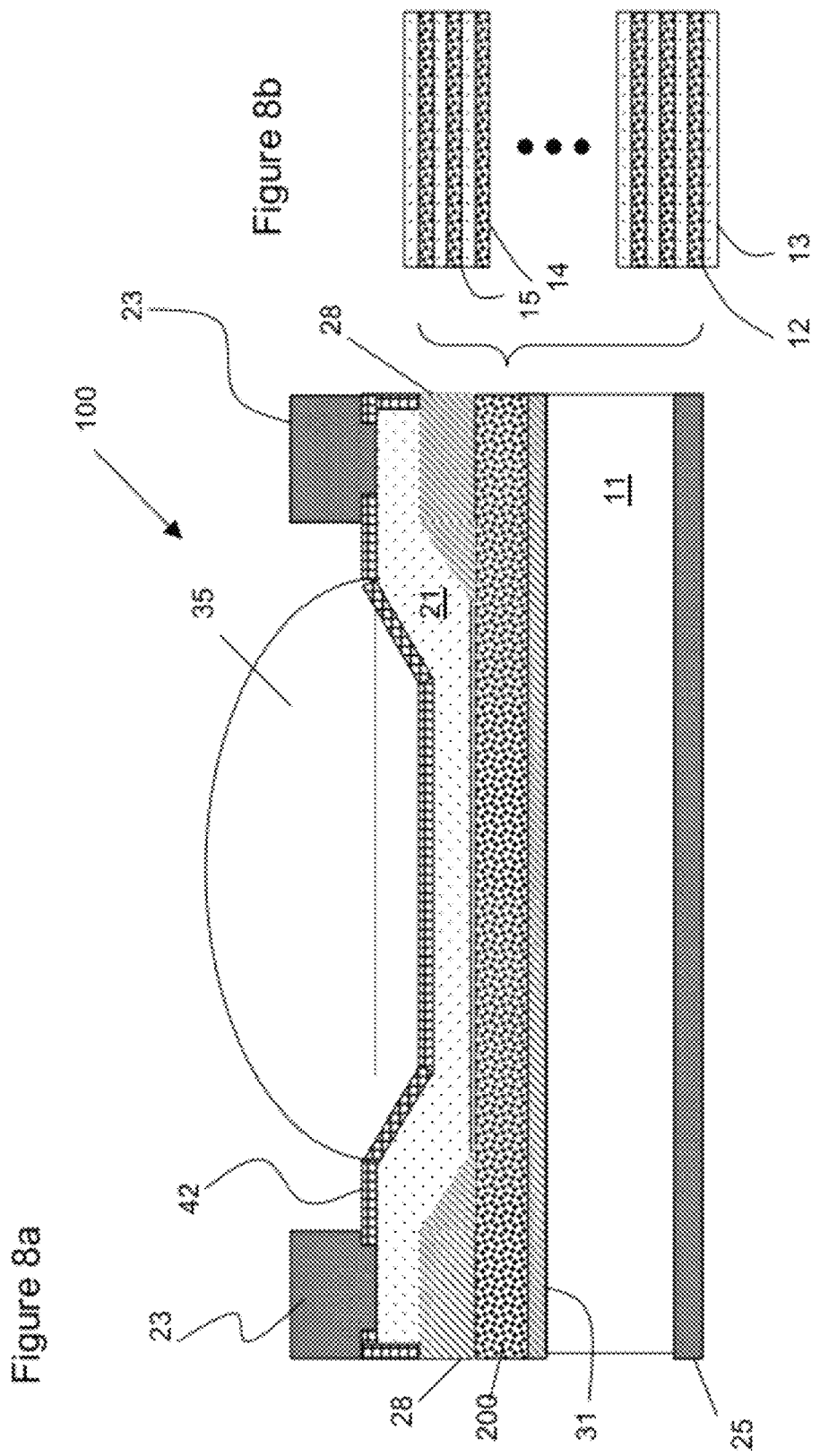

DEPOSITION OF THIN FILM DIELECTRICS AND LIGHT EMITTING NANO-LAYER STRUCTURES

CROSS-REFERENCE TO RELATED APPLICATIONS

This application is related to U.S. patent application Ser. No. 11/642,788, filed Dec. 12, 2006, now U.S. Pat. No. 8,093,604, entitled "Engineered Structure for Solid State Light Emitters," and U.S. patent application Ser. No. 12/508,033, filed Jul. 23, 2009, now U.S. Pat. No. 8,089,080, entitled "Engineered Structure for High Brightness Solid-State Light Emitters," both of which are incorporated herein by reference.

BACKGROUND

Applicants' related copending U.S. Pat. No. 8,093,604, entitled "Engineered Structure for Solid State Light Emitters," issued to Chik et al.; U.S. Pat. No. 7,800,117, entitled "Pixel Structure for a Solid State Light Emitting Device," issued to Chik et al.; and U.S. Pat. No. 8,089,080, entitled "Engineered Structure for High Brightness Solid-State Light Emitters," issued to Calder et al., which are incorporated herein by reference, disclose light emitting device structures and methods of fabrication of light emitting device structures from silicon or other group IV materials. In particular, high brightness, light emitting device structures are disclosed that comprise thin active layers, i.e., light emitting layers, comprising luminescent centers which may be electrically excited, such as rare earth ions in a rare earth oxide or other suitable host matrix. The host matrix may comprise a dielectric, such as silicon dioxide, silicon nitride, silicon oxynitride, silicon aluminum oxynitride (SiAlON), aluminum oxide, or other materials, such as disclosed in the above-referenced copending applications.

For excitation efficiency, a drift layer, i.e., an electron acceleration layer, comprising, for example, undoped silicon dioxide or silicon nitride, is provided adjacent each active layer. For high brightness light emitters, engineered structures are provided comprising a plurality of active layer and drift layer pairs, in which each drift layer has a thickness, dependent on the applied electric field, related to a desired excitation energy of an adjacent active layer. Multilayer light emitting structures may be provided, for example, comprising one or more active layers comprising rare earth doped silicon dioxide or silicon nitride, and corresponding drift layers comprising undoped silicon dioxide or silicon nitride. Active layers are thin and may be in the range from one monolayer (1 atomic layer) to 10 nm thick. Drift layers are typically 2-10 nm thick, depending on the applied electric field, to provide a sufficient thickness for acceleration of electrons for appropriate energy matching. Light emitting structures of this type may be fabricated as large area emitters or as pixel structures. Structures may comprise one active layer/drift layer pair or many, e.g., 24, layer pairs emitting one or more colors, to provide light emission of a desired Color Rendering Index (CRI).

With reference to FIG. 1, a light emitting device structure 1, similar to that described in the above-referenced copending U.S. patent applications, comprises a multilayer emitter structure 2 including a plurality of active layer/drift layer pairs, i.e., thin active layers of rare earth doped silicon nitride 3 and silicon dioxide drift layers 4, formed on a silicon substrate 6 with a back contact electrode 7. Also provided is a top electrode 8 comprising a transparent conducting oxide, such as indium tin oxide. Light emission from the multilayer emitter structure 1 may be electrically excited by application of a suitable AC or DC voltage 5 to the emitter layer structure 2 between the back contact electrode 7 and the top electrode 8.

For light emitting structures 1, as disclosed in the above mentioned references, which operate at relatively high electric fields, i.e., 5 MV/cm or more, high quality dielectrics with low trap density are included for reliability and extended lifetime. For high brightness and luminous efficiency, careful control of layer thicknesses is desirable. Such structures have been fabricated by plasma enhanced chemical vapor deposition (PECVD), for example.

Suitable rare earth containing oxides, or rare earth doped oxides or other dielectrics, can be formed by any of a number of techniques, such as ion implantation, chemical vapor deposition (CVD), physical vapor deposition, i.e., sputtering, spin-on (sol gel) techniques, beam deposition, laser deposition, or any of a large number of similar chemical or physical deposition techniques. Although epitaxial processes grow nano-structured single crystal semiconductor layers, e.g., for multiquantum well (MQW) semiconductor lasers with quantum well (QW) thicknesses on the order of 3-5 nm, these processes are typically applied for deposition of crystalline materials and are generally not applicable for amorphous, i.e., non-crystalline, dielectric layers. Methods, such as chemical vapor deposition (CVD), achieve high quality, uniform single layers of thin dielectrics, or a few thin film dielectric layers, i.e., the number of layers N=2 or 3, for such structures as transistor gate stacks. However, achieving high quality multilayer stacks (N>3) of thin films of amorphous or non-crystalline materials poses some challenges to known commercial chemical vapor deposition processes for volume production at reasonable cost.

Although light emitting device structures, such as shown in FIG. 1, have been fabricated by PECVD, for larger scale fabrication of multilayer light emitting structures, a suitable production class tool is suggested that is capable of deposition of high quality oxides and nitrides. In these respects, a low pressure (LP) CVD process, i.e., thermal CVD, for deposition of higher quality dielectrics offers some advantages over a PECVD process.

For commercial production of high quality, thin dielectrics such as silicon dioxide used for gate oxides for electronic devices, industry standard processes use chemical vapor deposition (CVD). That is, silicon dioxide and silicon nitride are typically produced by low pressure CVD from a mixture of reactant gases comprising a silicon source gas, typically silane ($SiH_4$), dichlorosilane ($SiH_2Cl_2$), or TEOS (tetra-ethyl ortho silicate ($Si(OC_2H_5)_4$) with an oxidation source gas, e.g., oxygen ($O_2$) or nitrous oxide ($N_2O$), or a nitridation source gas, e.g., ammonia ($NH_3$) or nitrogen ($N_2$), as appropriate. The reaction is thermally driven, at a relatively high temperature, e.g., 400-900 DC. Examples of systems and processes and examples of reactant gases and process conditions for chemical vapor deposition of silicon dioxide, silicon nitride, and silicon oxynitride are disclosed, for example, in U.S. Pat. Nos. 6,713,127; 6,884,464; and 7,465,669, issued to Iyer et al. (Applied Materials). To achieve uniformity and flatness of each layer in a multilayer structure, an optional post deposition treatment or passivation with the oxidation or nitridation source gas is also disclosed. That is, after deposition of a desired layer thickness, the flow of silicon source gas is turned off (or diverted) and the surface of the deposited layer is then exposed to a flow of nitridation or oxidation source gas, i.e., ammonia or nitrous oxide. This post treatment of the deposited layer with oxidation or nitridation source gas is explained in U.S. Pat. Nos. 6,713,127 and 6,884,464 as terminating unreacted silicon sites to maximize uniformity and minimize surface roughness of the deposited layers.

However, attempts to fabricate larger area, thin film dielectric layers for multilayer light emitting structures, as described above, using available commercial thermal CVD processes and equipment, and reactant gas mixtures and process conditions, such as those described in the aforementioned patents, do not provide sufficient control of the layer thicknesses, uniformity, and layer-to-layer reproducibility for such light emitting structures. In fabricating a light emitting device structure wherein active layers comprise rare earth doped silicon nitride, and drift layers comprise silicon dioxide, there is breakdown of the layer structure after deposition of the first few layers on a silicon substrate. For example, FIG. 2 shows a transmission electron micrograph (TEM) cross section through a multilayer structure comprising five periods, i.e., five layer pairs, deposited using conventional disilane chemistry and process sequence, and including a step of post-deposition treatment with the oxidation or nitridation source gas, as described above.

The photomicrograph in FIG. 2 illustrates an example of the multilayer emitter structure 2, which comprises a plurality of thin layers of silicon nitride 3 and silicon dioxide 4, formed on a silicon substrate 6. In FIG. 2, the silicon nitride layers 3 appear with darker contrast than the silicon dioxide layers 4. The multilayer emitter structure 2 was deposited by a process of thermal chemical vapor deposition (CVD) at low pressure, using disilane as the silicon source gas, and an oxidation source gas comprising $N_2O$ or a nitridation source gas comprising $NH_3$, to produce the silicon dioxide or silicon nitride layers, respectively. After suitable preparation of the silicon substrate 6, deposition of a layer of silicon dioxide 4 or silicon nitride 3 proceeds by introducing a suitable mixture of reactant gases, together with an inert carrier gas into the CVD reaction chamber at an appropriate temperature and pressure. The substrate 6 is exposed to the reactant gas mixture for a time sufficient to deposit a desired thickness of dielectric, i.e., silicon nitride 3 or silicon dioxide 4. When the desired thickness of dielectric is reached, the disilane flow is switched off or diverted, and the flow of nitridation or oxidation source gas, e.g., $N_2O$ or $NH_3$, is continued for post treatment, i.e., to terminate reactive silicon and passivate the surface of the deposited dielectric layer 3 or 4. After purging the chamber with inert carrier gas, the reactant gas mixture for deposition of the next layer is introduced into the chamber, and so on. This allows a number of silicon nitride layers 3 and silicon dioxide layers 4 of a predetermined thickness to be deposited sequentially.

However, as will be seen from FIG. 2, although reasonable uniformity of the layer thickness is obtained for the first silicon dioxide layer 4, the layer structure begins to break down as more layers are deposited. Several layers into the structure, significant surface structure and roughness of each layer is apparent, which propagates through subsequently deposited layers. Thus, for example, in a large area multilayer structure, such as for a light emitting device structure 2 as shown schematically in FIG. 1, that includes, for example, 48 layers, i.e., 24 layer pairs, of active silicon nitride layers 3 comprising a luminescent species, and respective drift silicon dioxide layers 4, this structure is far from ideal. The light emitting structure 2 in FIG. 2 shows surface roughness exceeding 1 nm. In particular, in a light emitting structure, careful control of the drift layer thickness is desirable for controlling excitation energy in operation of the device, and because such devices operate at relatively high fields, high quality oxides or nitrides, free of defects, are used for reliability and extended lifetime. As apparent from FIG. 2, surface "roughness" or discontinuities in the layers structure are as large as the thickness of the layer. Consequently this process, even with post treatment of the deposited layers with the oxidation or nitridation source gas, cannot meet the specifications for a multilayer light emitting device structure described above, including sub-nanometer surface roughness.

Consequently, processes are suggested for deposition of multilayer light emitting structures comprising nano-layer dielectrics, particularly for layers less than 10 nm thick, where careful control of layer uniformity, thickness, surface roughness or flatness, and layer-to-layer reproducibility is desired.

It is desirable to provide for uniformity and flatness of dielectric layers for light emitting structures and other semiconductor devices.

Thus, alternative or improved materials, structures, and/or methods of fabrication for solid-state light emitters, particularly for applications requiring higher brightness, luminous efficacy and reliability, such as solid-state lighting or devices, are desired.

BRIEF DESCRIPTION OF THE DRAWINGS

FIG. 3A shows an enlarged schematic view of an interface between first and second dielectric layers deposited using a CVD process;

FIG. 3B shows an enlarged schematic view of the interface between first and second dielectric layers deposited by a CVD method according to a representative embodiment of the present disclosure;

FIG. 8A shows schematically a light emitting device structure comprising a multilayer light emitting structure according to an embodiment of the present disclosure; and FIG. 8B shows an enlarged view of the multilayer light emitting structure of FIG. 8A.

DETAILED DESCRIPTION

Figure 1:
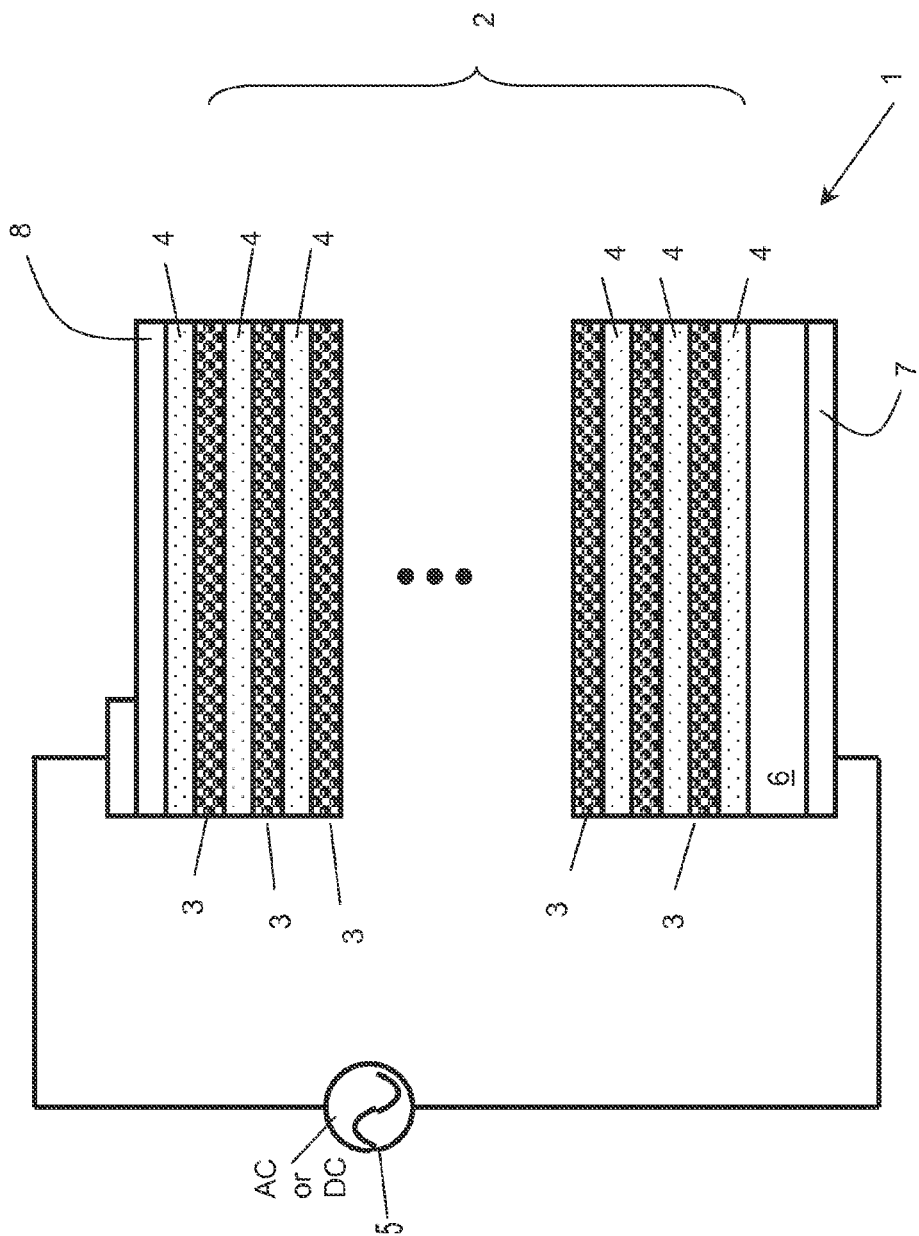
FIG. 1 is a schematic illustration of a light emitting device comprising an emitter layer structure.

The present disclosure seeks to overcome or mitigate the above-mentioned problems relating to deposition of thin film dielectrics and deposition of nano-layer structures for solid-state light emitters, or at least provide alternatives.

One aspect of the present disclosure provides a method of fabricating a thin film dielectric structure for a semiconductor device comprising:

(a) depositing a first layer, comprising a first dielectric, on a substrate; and (b) surface treating the first layer with a surface-activating reactant gas.

When the thin film dielectric comprises a plurality of layer pairs of first and second dielectric layers, steps of deposition of a first or second dielectric layer and post deposition surface treatment thereof are repeated sequentially to provide a desired number of layer pairs.

Another aspect of the present disclosure provides a method of depositing, by chemical vapor deposition (CVD) in a CVD reaction chamber, a thin film dielectric stack comprising:

(a) providing a substrate;

(b) depositing a first dielectric layer of a first desired thickness by exposure of the substrate to a first reactant gas mixture comprising a silicon source gas, a nitridation source gas, and an oxidation source gas;

(c) surface treating the first dielectric layer by exposure to the silicon source gas;

(d) depositing a second dielectric layer of a second desired thickness by exposure to a second reactant gas mixture comprising a mixture of a silicon source gas and at least one of a nitridation source gas and an oxidation source gas; and (e) surface treating the second dielectric layer by exposure to the silicon source gas.

In particular, dielectric layers such as oxides, nitrides, or oxynitrides of silicon, or other silicon compatible dielectrics, with or without dopants, such as rare earth luminescent centers, may be deposited with significantly increased uniformity, and reduced surface roughness, approaching atomically flat layers. For example, multilayer thin film dielectrics may be deposited by thermal CVD, characterized by a surface roughness of less than 0.21 nm, when the deposited dielectric layer is surface treated with a silicon source gas, and silane in particular, before depositing a subsequent layer thereon.

For increased layer-to-layer uniformity, multilayer dielectric structures suitable for light emitting structures may be deposited by surface treating each individual dielectric layer with silane prior to deposition of a subsequent layer.

Further aspects of the disclosure provide semiconductor devices structures and light emitting device structures comprising thin film dielectric layers deposited by these methods. For light emitting device structures, active (light emitting) layers may be doped with luminescent rare earth species or other luminescent centers.

Thus, in a representative embodiment, a light emitting device structure may be provided comprising a plurality of active layer and drift layer pairs, each of the active and drift layers comprising a substantially atomically flat dielectric layer deposited by chemical vapor deposition. In representative embodiments of this structure, each dielectric layer is selected from the group consisting of doped and undoped oxides and nitrides of silicon. Each active layer comprises luminescent centers, such as a rare earth, e.g., cerium, and has a thickness from 1 monolayer to 10 nm. Each drift layer has a thickness from 2-10 nm. Each layer has a surface roughness of less than 0.21 nm. Light emitting structures may comprise a layer stack comprising one or more active layer/drift layer pairs, wherein the drift layers are configured with electrode structures, as appropriate, for DC or for AC operation.

For example, for fabrication of a multilayer dielectric stack for use in a light emitting structure, the first dielectric layer may comprise rare earth doped silicon nitride (active layer) deposited from a reactant mixture of silane and ammonia ($NH_3$). The second dielectric layer may comprise silicon dioxide (drift layer). To deposit silicon nitride, the first reactant gas mixture comprising silane and ammonia, together with a suitable source of rare earth dopant if desired, is introduced into the chamber to deposit a desired thickness of the first dielectric layer, i.e., the rare earth doped silicon nitride.

Then the exposure of the substrate to the flow of all reactant gases is stopped, with the exception of the silicon source gas, which in this embodiment is silane. Silane is flowed into the chamber, with an inert carrier gas to maintain pressure and flow dynamics, for a sufficient time to surface treat the deposited layer. After purging the chamber, a second mixture of reactant gases consisting of silane and nitrous oxide are introduced into the chamber to deposit a thickness of silicon dioxide, and then the oxygen containing reactant gas flow is stopped, to expose the deposited surface to silane. Thus after deposition of each dielectric layer, the surface of the deposited dielectric layer is treated briefly by exposure to the silicon source gas, plus additional non-reactive carrier gases to maintain chamber pressure and flow dynamics, and then the chamber is purged with the carrier gas or gases, before deposition of the next layer. Silane treatment of the deposited dielectric layer is generally long enough to enhance flatness, e.g., by providing active silicon or a monolayer of silicon on the surface, while avoiding formation of a layer of amorphous silicon or polycrystalline silicon.

While this method is particularly suitable for deposition of engineered light emitting structures as described in the above-referenced copending patent applications, thin, well-defined doped or undoped dielectric layers that are substantially atomically flat are also desirable for many other electronic devices such as gate oxides for transistor gate stacks, and gate oxide or tunnel oxides for memory or flash devices.

While methods according to representative embodiments are particularly suitable for deposition by thermal CVD of commonly used silicon-containing dielectrics such as nitrides, oxides, and oxynitrides of silicon, similar surface activating treatment may be applicable for deposition of other dielectrics, e.g., SiAlON or aluminum oxide, or other dielectrics of similar structure or surface chemistry with layer-to-layer reproducibility and reduced surface roughness. More generally, during chemical vapor deposition of dielectrics comprising oxides, nitrides, or oxynitrides of metal or semiconductor species M, deposited layers are surface treated with an appropriate M source gas, before deposition of a subsequent dielectric layer.

Methods and structures according to embodiments of the present disclosure therefore provide for enhanced flatness, reduced surface roughness, and layer-to-layer uniformity in multilayer semiconductor device structures, and particularly for light emitting device structures.

Figure 3:
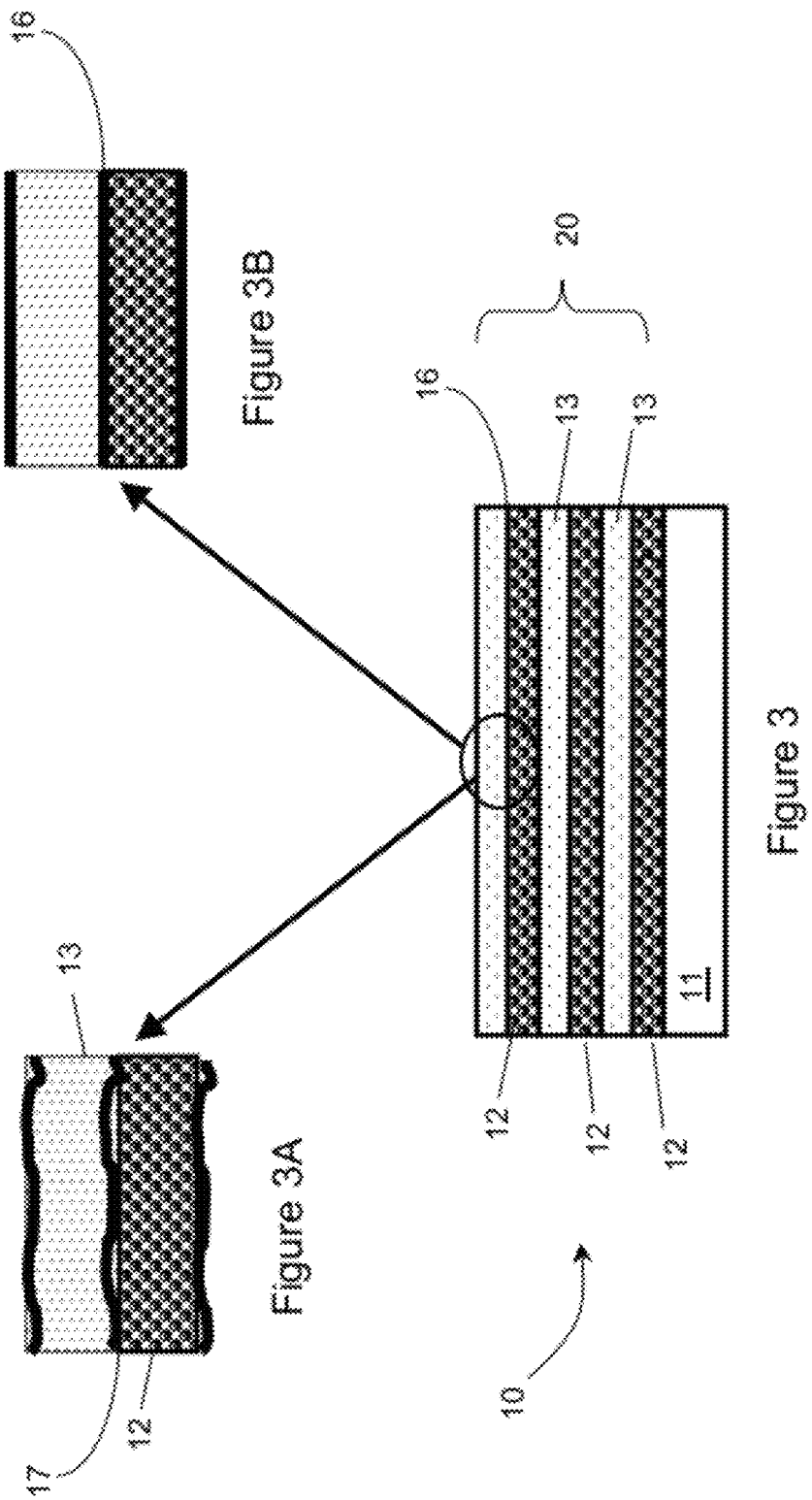
FIG. 3 is a schematic illustration of a multilayer dielectric structure according to an embodiment of the present disclosure.

With reference to FIG. 3, a device structure 10, in accordance with an embodiment of the present disclosure, comprises a multilayer dielectric stack 20 including a plurality of first and second dielectric layer pairs 12 and 13. Each first dielectric layer 12 comprises, for example, silicon nitride, and each second dielectric layer 13 comprises, for example, silicon dioxide, formed on a substrate 11, e.g., a silicon substrate wafer, or other suitable substrate material or underlying semiconductor device structure.

Typical materials for thin film dielectric structures comprising multilayer dielectric stacks, e.g., for light emitting devices or in other semiconductor device structures, may comprise, for example, suitable oxides, nitrides, or oxynitrides of a metal or a semiconductor. Silicon dioxide, silicon nitride, and silicon oxynitride are widely used as dielectrics for silicon process technology. Other examples include silicon aluminum oxynitride (SiAlON) and aluminum oxide. Metal oxides, such as hafnium or zirconium oxide, or metal silicates may be used for high-k gate dielectrics. Dielectrics comprising luminescent centers, such as rare earth doped silicon nitride or silicon dioxide, or rare earth oxides may be used for light emitting devices.

When the multilayer dielectric stack 20 of FIG. 3 forms part of a light emitting structure, selected layers, e.g., the first dielectric layers 12 of each layer pair, may be doped with luminescent centers, e.g., rare earth luminescent centers, to provide active layers of the light emitting structure, such as described in the applicants' above-referenced copending U.S. patent applications, as illustrated in FIG. 1, with intervening undoped drift layers 13. In this and other semiconductor device structures, it may be desired to deposit multiple dielectric layer pairs 12 and 13 having various thicknesses from one monolayer to about 10 nm thick, with careful control of the thickness of each layer, to provide layer-to-layer uniformity through many layers.

Thus, each layer 12 and 13 is deposited by a method that provides a smooth surface, with minimal surface roughness, and where there is an abrupt and atomically flat interface 16, between layers 12 and 13, as represented in FIG. 3B, which represents an enlarged view of the interface 16 between first and second dielectric layers 12 and 13. On the other hand, as represented (not to scale) in FIG. 3A, if the interface 17 between each layer 12 and 13 shows a significant degree of surface roughness, this will result in non-uniformities in film thicknesses and breakdown of layer-to-layer uniformity.

Figure 4:
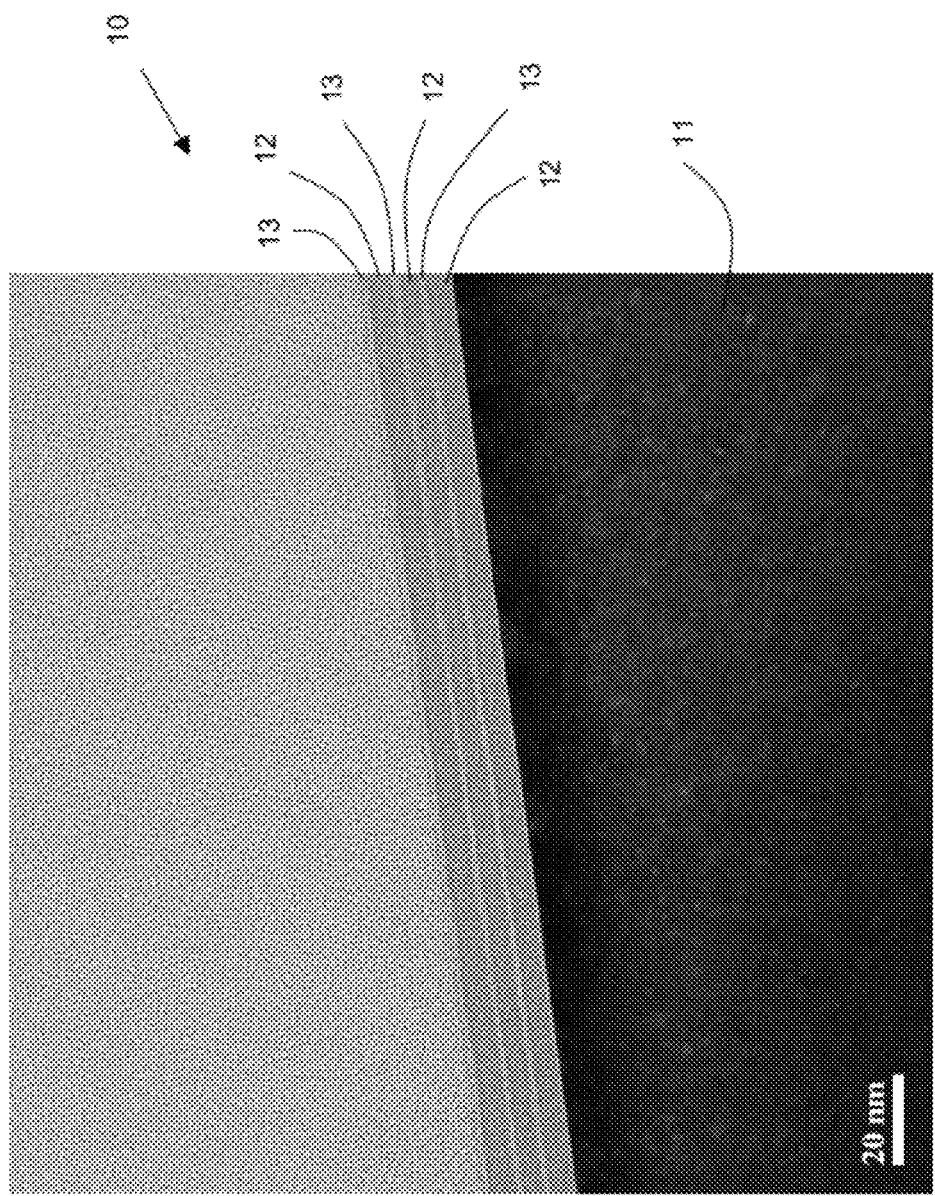
FIG. 4 shows a TEM photomicrograph of a multilayer structure for an emitter layer structure similar to that shown in FIG. 3B.

With reference to FIG. 4, a TEM image is shown of a multilayer device structure 10, fabricated by a method according to an embodiment of the present disclosure, comprising three periods (three layer pairs) of a layer stack comprising first dielectric layers 12, comprising silicon nitride, and second dielectric layers 13, comprising silicon dioxide, deposited on a substrate 11, which, in this embodiment, comprises silicon.

Figure 2:
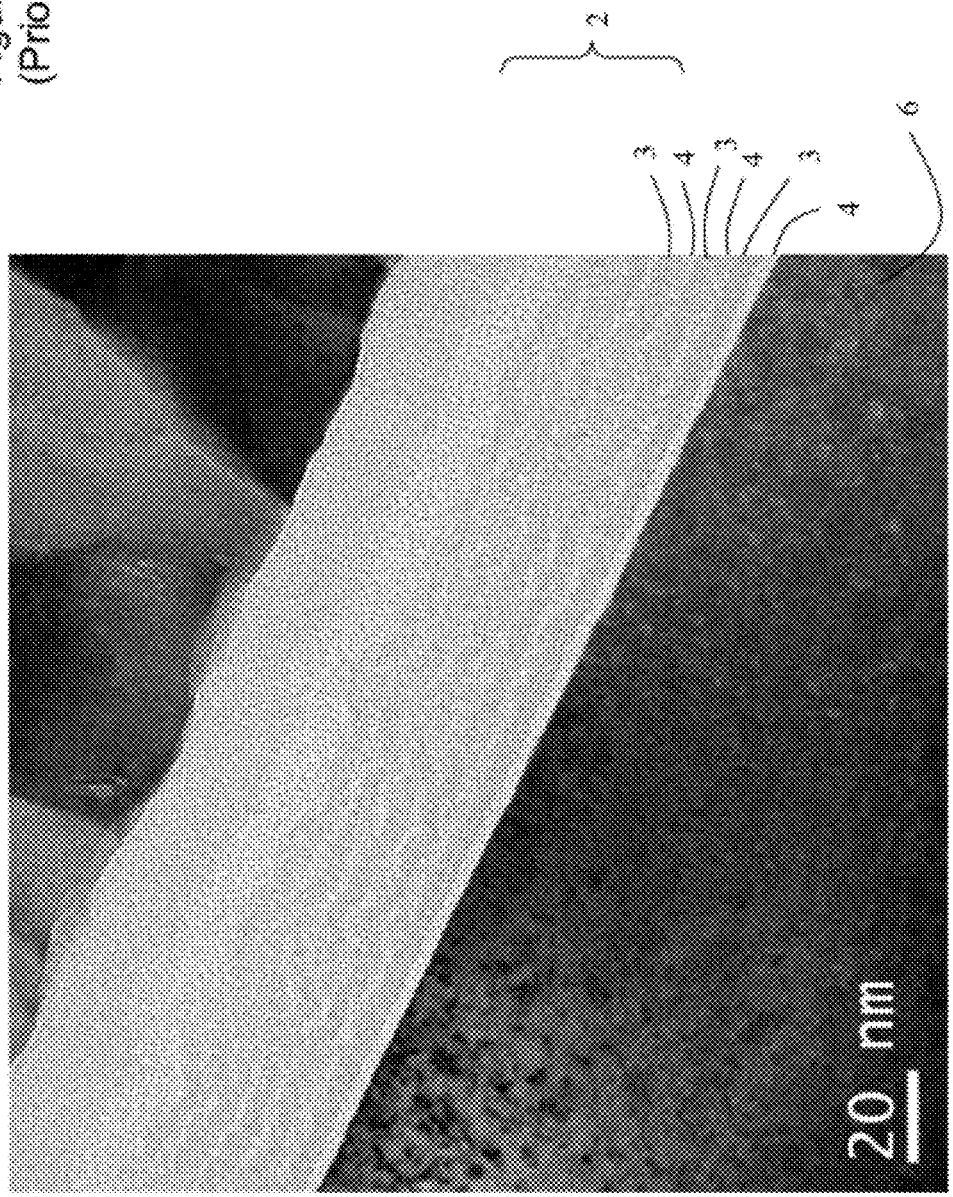
FIG. 2 shows a TEM photomicrograph of a multilayer structure similar to the emitter layer structure shown in FIG. 1.

Relative to the structure fabricated and shown in the TEM image of FIG. 2, it is apparent from the structure 10 of the embodiment shown in the TEM image in FIG. 4, that significantly increased uniformity and lateral continuity of layers is achieved, and surface roughness was significantly reduced, to provide substantially atomically flat layers, with abrupt transitions at the interfaces 16 between layers 12 and 13.

Figure 5:
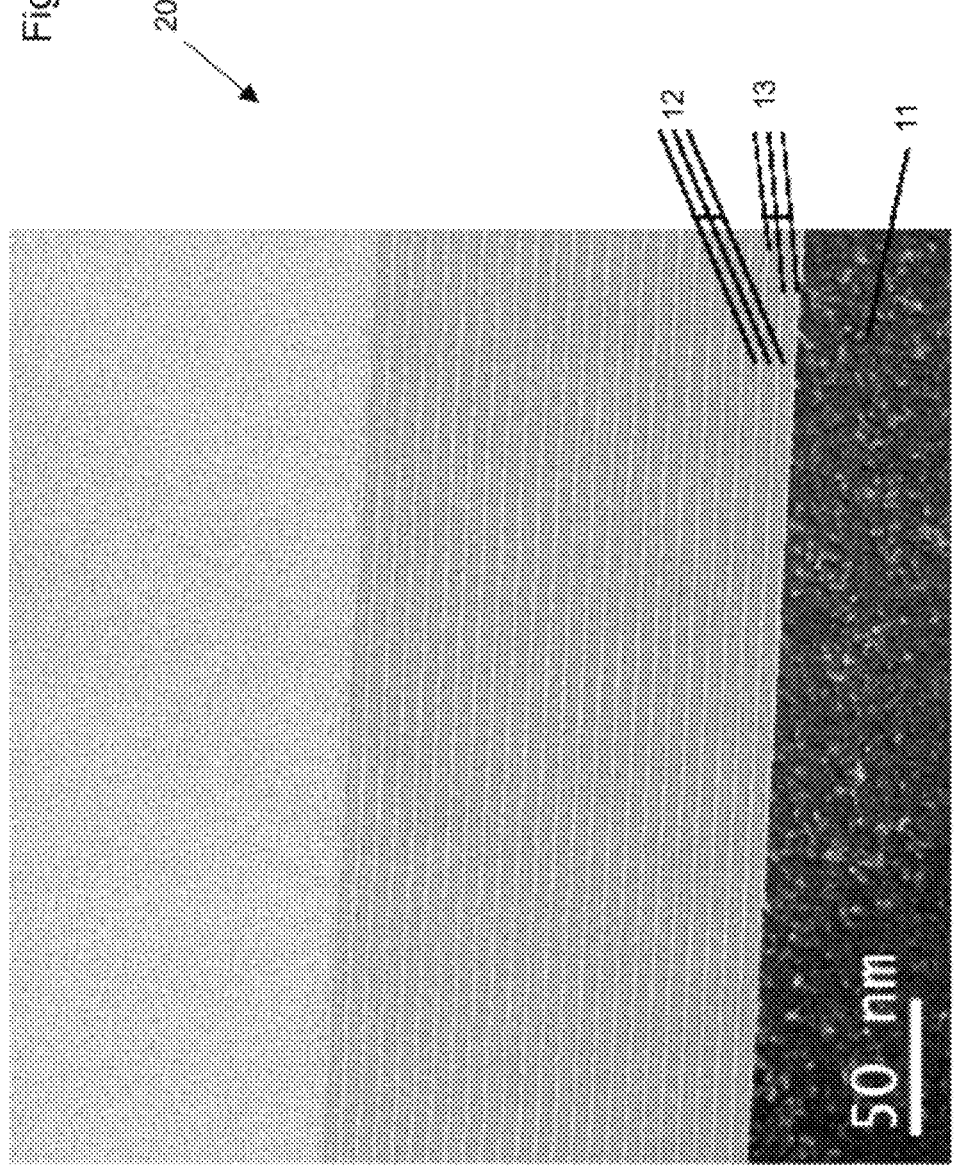
FIG. 5 shows a TEM photomicrograph of another multilayer emitter structure comprising a plurality of thin dielectric layers.

With reference to FIG. 5, a TEM photomicrograph of another multilayer device structure 20, in accordance with another embodiment of the present disclosure, comprises 48 layers (24 layer pairs) of the first dielectric layers 12, comprising silicon nitride, and second dielectric layers 13, comprising silicon dioxide fabricated on a silicon substrate 11, by a method according to a representative embodiment of the present disclosure. As is apparent from this image, significantly increased layer-to-layer uniformity and continuity are maintained up to 48 layers, and surface roughness was significantly reduced to provide substantially atomically flat layers throughout the 24 periods (first dielectric layer 12/second dielectric layer 13 pairs) of the multilayer light emitting device structure 20. The multilayer device structure 20 is provided in which the surface of each of the first and second dielectric layers 12 and 13 is characterized by a surface roughness of 0.21 nm or less, e.g., as measured by AFM (atomic force microscopy).

Figure 6:
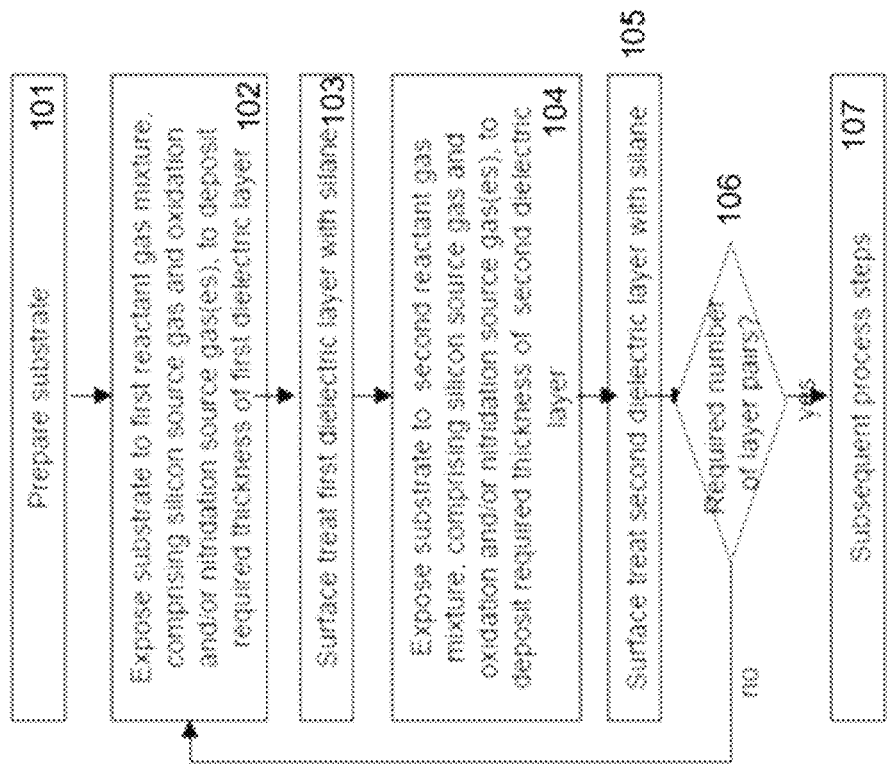
FIG. 6 illustrates a process flow chart for deposition of dielectric layers and surface treatment by a method according to an embodiment of the disclosure.
Figure 7:
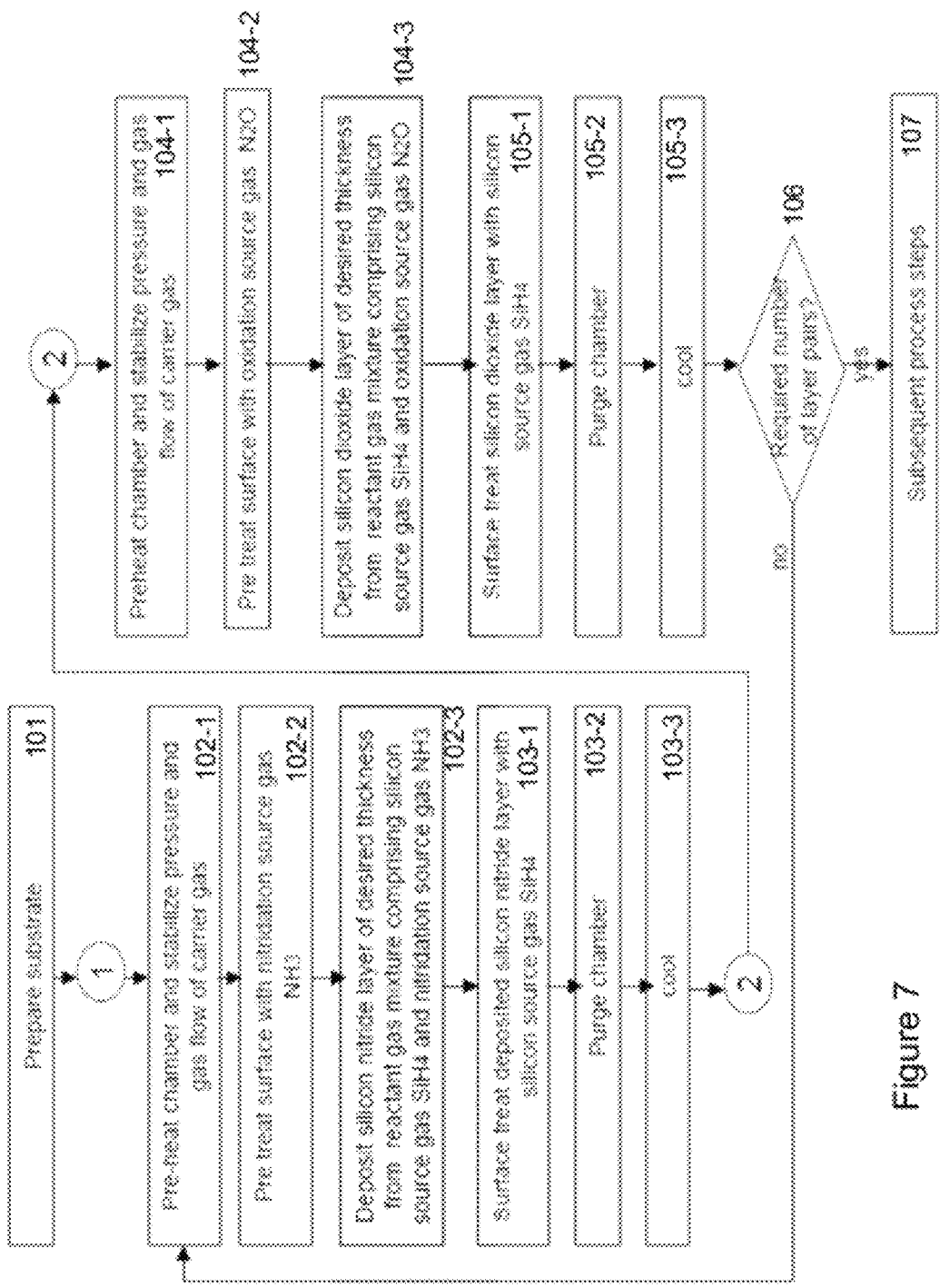
FIG. 7 illustrates a more detailed process flow chart for a method according to an embodiment of the disclosure for deposition of a structure as shown in FIGS. 4 and 5.

The multilayer device structures 10 and 20, shown in FIGS. 4 and 5, were deposited by the process steps represented in FIGS. 6 and 7. By way of example, a process is described for deposition of a first dielectric layer 12, comprising silicon nitride, and a second dielectric layer 13, comprising silicon dioxide, although it will be appreciated that, alternatively, deposition of the dielectric layer stack may commence with a layer of silicon dioxide. As shown in FIG. 7, after suitable preparation of the silicon substrate 11 at 101, the chamber was preheated and the carrier gas (i.e., nitrogen) pressure and gas flow is stabilized, as at 102-1. Next, the surface of the substrate 11 was pre-treated with the nitridation source gas, i.e., ammonia $NH_3$ as at 102-2. A first reactant gas mixture comprising a silicon source gas, e.g., silane, the nitridation source gas, e.g., ammonia, and the inert carrier gas (nitrogen), for deposition of the first dielectric layer 12, comprising silicon nitride, was introduced into the reaction chamber at a temperature of 750° C. and a pressure of 240 Torr. The substrate 11 was exposed to the reactant gas mixture for sufficient time to deposit a desired thickness of silicon nitride for the first dielectric layer 12, as at 102-3. In this example, a deposition time of 11.5 seconds provided a first dielectric layer 12 of silicon nitride with a thickness of 5 nm. The flow of ammonia reactant gas was then turned off, but the flow of a surface-activating reactant gas, e.g., the silicon source gas: silane, was allowed to continue for surface treatment of the deposited silicon nitride dielectric layer 12, as at 103-1, before purging the chamber with carrier gas (103-2) and cooling the chamber (103-3).

For deposition of the subsequent dielectric layer, i.e., a second dielectric layer 13 comprising silicon dioxide, the chamber was preheated again (104-1), and the surface of the first dielectric layer 12 (silicon nitride) was pre-treated with an oxidation source gas $N_2O$, as at 104-2. Then, a second reactant gas mixture comprising a silicon source gas, e.g., silane, and oxidation source gas, e.g., nitrous oxide, together with the carrier gas, is introduced into the chamber for deposition of the second dielectric layer 13 comprising silicon dioxide. The substrate 11 and the first dielectric layer 12 were exposed to the second reactant gas mixture for sufficient time, i.e., 8 seconds, to deposit the desired thickness of the layer 13, e.g., 4 nm of silicon dioxide, as at 104-3. The flow of the oxidation source gas, i.e., nitrous oxide reactant gas, was then turned off, but the flow of the silicon source gas, i.e., silane, was continued for surface treatment of the deposited silicon dioxide dielectric layer 13, as at 105-1, and then the chamber was purged with the carrier gas (105-2) and cooled (105-3). The sequence was repeated until the desired number of periods of first and second dielectric layer pairs 12 and 13 of the multilayer device structure 10 or 20 were provided, as at 106.

After preparing the multilayer device structure 10 or 20 by process steps as summarized in FIG. 6, and shown in more detail in FIG. 7, then subsequent process steps 107 may proceed if desired, e.g., to provide a light emitting device or other semiconductor device.

The duration of the surface treatment with the surface-activating reactant gas, e.g., silane, after deposition of each dielectric layer 12 and 13 is desired to be long enough to increase flatness, but sufficiently short to avoid formation of a layer of amorphous silicon or polycrystalline silicon on the dielectric surface. For example: for the process conditions summarized in Tables 1 and 2, surface treatment with the silicon source gas for 1 second after turning off the oxidation or nitridation source gases was sufficient to provide flatness, although exposure to the silicon source gas for surface treatment or surface activation may be in the range from about 0.5 seconds up to about 10 seconds.

As shown in FIGS. 6 and 7, for the step 102 of deposition of each of the first and second dielectric layers 12 and 13, to stabilize the chamber, the chamber is preheated (102-1) with a flow of inert or non-reactive carrier gas, i.e., nitrogen, and the flow of the oxidation or nitridation source gas is initiated first before diverting flow of the silicon source gas into the chamber to initiate the reaction for deposition of the desired thickness of the respective dielectric layers 12 or 13. After stopping flow of the oxidation or nitration source gas, the deposited layer 12 or 13 is surface treated by exposure to the surface-activating reactant gas, e.g., silane. The chamber is purged (103-2) with the carrier gas after step 103-1 of surface treatment of the deposited dielectric layer 12 or 13 with the silicon source gas. The process according to the embodiment was carried out in a thermal CVD deposition chamber, which provides for the introduction of the carrier gas and/or reactant gas mixture in the upper region for exposure of the substrate for deposition, and a second input for a bottom flow of carrier/purge gas. The carrier gas flow maintains the chamber pressure and flow dynamics, and is continued during surface treatment of deposited layers 12 and 13 with the surface-activating reactant gas, e.g., the silicon source gas: silane. Gas flows and process conditions for deposition of dielectric nano-layer pairs 12 and 13 comprising 5 nm of silicon nitride and 4 nm of silicon dioxide are summarized below, in Tables 1 and 2, respectively.

Similar process steps can also be used for the deposition of a multilayer light emitting device structure, similar to the multilayer device 20 shown in FIG. 5, by repeating the process steps for the deposition of 24 periods, i.e., 24 active layer 12/drift layer 13 pairs, of a light emitting structure comprising rare earth doped silicon nitride active layers and silicon dioxide drift layers.

TABLE 1

Deposition of silicon nitride layers

|  | Preheat | $NH_3$ surface pre-treatment | $Si_3N_4$ deposition | $SiH_4$ surface post treatment | $N_2$ purge |
|---|---|---|---|---|---|
| Temperature (C.) | 750 | 750 | 750 | 750 | 750 |
| Pressure (Torr) | 240 | 240 | 240 | 240 | 240 |
| Time (second) | 45 | 5 | 11.5 | 1 | 35 |
| $N_2$ (sccm) | 13000 | 13000 | 13000 | 13000 | 10000 |
| $N_2$ bottom (sccm) | 16000 | 16000 | 16000 | 16000 | 6000 |
| $SiH_4$ (sccm) |  |  | 17 | 17 |  |
| $NH_3$ (sccm) |  | 100 | 100 |  |  |

TABLE 2

Deposition of silicon dioxide layers

|  | Preheat | $N_2O$ surface pre-treatment | $SiO_2$ deposition | $SiH_4$ surface treatment | $N_2$ purge |
|---|---|---|---|---|---|
| Temperature (C.) | 750 | 750 | 750 | 750 | 750 |
| Pressure (Torr) | 275 | 275 | 275 | 275 | 275 |
| Time (second) | 80 | 20 | 8 | 1 | 10 |
| $N_2$ (sccm) |  | 12000 | 12000 | 12000 | 14000 |
| $N_2$ bottom (sccm) |  | 10000 | 10000 | 10000 |  |
| $SiH_4$ (sccm) |  |  | 3.5 | 3.5 |  |
| $N_2O$ (sccm) |  | 3000 | 3000 |  |  |

Thus, as illustrated by the TEM photomicrographs shown in FIGS. 4 and 5, a method according to this embodiment provides for control of the uniformity, flatness, and thickness of thin film dielectric structures 10 and 20 comprising multiple nano-layers, such as active layers 12 and drift layers 13 for light emitting device structures. The surface treatment by the surface-activating reactant gas, e.g., silicon source gas: silane, provides for dielectric layers 12 and 13, which are substantially atomically flat, with excellent layer-to-layer reproducibility. RMS surface roughness of <0.21 nm was maintained in the multilayer device structures 10 and 20.

Notably, the remarkable and unexpected increase in flatness achieved with the process described above could not be achieved using conventional known post-deposition treatment processes with oxidation or nitridation source gases. Indeed surface treatment of the deposited silicon nitride or silicon dioxide dielectric layers 12 and 13, which results in flatness and uniformity, appears to be specific to treatment with the silicon source gas, e.g., silane.

By comparison, post treatment of silicon dioxide layers with the oxidation source gas (nitrous oxide) or post treatment of silicon nitride layers with the nitridation gas (ammonia), which has been reported to passivate each layer and terminate active silicon sites for reduced surface roughness, resulted in the rough surface structures, as shown in FIG. 2.

As illustrated by the gas flows listed by way of example in Table 1 and Table 2, during deposition of the silicon nitride or silicon dioxide layers, there is a relatively small flow of silicon source gas relative to the flow of oxidation or nitridation source gas. During surface treatment with the silicon source gas, the flows of nitridation and/or oxidation source gases are turned off, and the flow of silicon source gas is continued, so that the surface of the deposited dielectric is exposed to the silicon source gas, or at least, a very high ratio of the silicon source gas relative to any residual reactant source gases, i.e., residual oxidation and or nitridation or source gas, that may remain in the chamber during the step of surface treatment.

Surface treatment of the deposited layers 12 and 13 with another silicon source gas, i.e., disilane, did not result in dramatic flatness compared with the use of silane. The difference may be attributable to different surface chemistry effects, or may, in part, be due to a higher impurity level of the available disilane source compared with the silane source.

Without wishing to be limited by any particular theory, the present inventors believe that the significant increase in surface flatness using silane chemistry for deposition and silane surface treatment of the deposited dielectric layer is primarily due to surface chemistry effects on the dielectric surface, i.e., surface activation of the dielectric surface to create active silicon sites. Thus, it is believed that surface treatment, with silane or other silicon source gases, provides active silicon on the surface, e.g., a monolayer of silicon or a silicon rich surface that facilitates deposition of subsequent layers with increased layer-to-layer uniformity and reduced surface roughness in multilayer structures. Surface treatment with silane is particularly effective.

While specific embodiments of the method are described above, it will be appreciated that, in other embodiments, similar doped and undoped dielectric layers, such as metal or semiconductor oxides or nitrides, e.g., silicon nitride, silicon dioxide, silicon oxynitride, hafnium oxide, zirconium oxide, silicon aluminum oxynitride (SiAlON), and aluminum oxide, may be deposited from other reactant gas mixtures comprising a semiconductor or metal, e.g., silicon, source gas, and one or more reactant source gases, e.g., a nitridation and/or an oxidation source gas, using a range of process conditions, for example, systems and processes as described in the above-referenced U.S. patent applications to Applied Materials, or other CVD apparatuses and processes. However, instead of a post-deposition treatment by passivation of the surface of each deposited layer with either of the reactant source gases, i.e., nitridation or oxidation source gases, the deposited layers in some embodiments are surface treated after deposition with a brief exposure to a surface-activating gas, i.e., the metal or semiconductor source gas, such as silane, together with appropriate non-reactive carrier gas(es) to maintain chamber pressure and flow dynamics, to provide active metal or semiconductor on the exposed surface before subsequent processing.

Optionally, dopants may be added to one or more of the first and second dielectric layers 12 and 13, by addition of a suitable dopant precursor to the respective reactant gas mixture. Thus, for light emitting structures in which the first dielectric layers 12 are active layers containing rare earth luminescent centers, for example, a suitable rare earth precursor is added the reactant gas mixture during deposition of the active layers.

Thus, for example, in alternative embodiments for deposition of oxides, nitrides, and oxynitrides of silicon by thermal CVD, pressure in the reactor or deposition chamber may be maintained in the range from about 50-350 Torr, temperatures in the range from about 400-900° C., and appropriate flow ratios of silicon source gas and nitridation and/or oxidation source gases in the range 1:50 to 1:10000 to provide a suitable deposition rate, e.g., approximately 30 nm/min to enable sufficient control of the thickness of the deposited layers 12 and 13 of less than 10 nm in deposition times of approximately 10 seconds per layer. The silicon source gas may be silane, disilane, methylsilane, or halogenated silanes, or other suitable silicon source gases, although silane is desired for the step of surface treatment and surface activation of the deposited dielectric layers 12 and 13. Nitrous oxide, ozone, or TEOS may be used as an oxidation source gas, for example. Ammonia or hydrazine may be used as a nitridation source gas, for example. The carrier gas may be nitrogen, argon, xenon, or helium, for example.

The surface activation treatment with silicon source gas, and silane in particular, is applicable to fabrication of other similarly structured dielectric thin films comprising other dielectrics which are compatible with silicon technology, such as, silicon aluminum oxynitride (SiAlON). For other doped or undoped dielectrics that have similar surface chemistry, such as other semiconductor or metal oxides, nitrides, or oxynitrides, surface treatment by exposure of the deposited dielectric layer to a respective semiconductor or metal source gas to activate the surface before deposition of subsequent dielectric layers may similarly reduce surface roughness and increase layer-to-layer uniformity in multilayer structures.

More generally, in deposition of other thin film dielectric layers, for semiconductor devices comprising oxides, nitrides, or oxynitrides of semiconductors and/or metals, a similar surface activation treatment would be beneficial in improving flatness and layer-to-layer uniformity in deposition of multilayer structures. Typically, a semiconductor or metal-containing dielectric is deposited from a reactant gas mixture comprising a first reactant, which is semiconductor/metal (M) source gas, and a second reactant, e.g., at least one of an oxidation and nitridation source gas. Instead of surface passivation with the second reactant, i.e., the oxidation or nitridation source gas, the deposition of multilayer structures, according to embodiments of the present disclosure, includes reducing or stopping the flow of the second reactant, during surface treatment, and to exposing of the deposited dielectric layer to the reactive gas source of the appropriate semiconductor or metal (i.e., cationic) species (M) to provide active species of M, or a monolayer of M, on the surface of a deposited dielectric layer. Thus, when the dielectric layer is deposited from a reactant gas mixture comprising a semiconductor/metal M source gas and one or more of a nitridation and an oxidation source gas, after deposition of a dielectric layer of the desired thickness, the flow of the oxidation and nitridation source gases are terminated, and the surface of the deposited layer is treated by continued exposure to the flow of the reactant metal/semiconductor source gas alone, together with appropriate carrier gases to maintain the chamber pressure and flow dynamics. One example would be surface treatment of aluminum oxide dielectric layers ($Al_2O_3$) with an aluminum source gas.

An engineered structure for a light emitting device 100, as described in the above-referenced copending patent applications by Chik et al., is illustrated in FIGS. 8A and 8B. A multilayer light emitting structure 200, fabricated similar to the multilayer structures 10 and 20, as shown in FIGS. 3-5, comprises one or more first dielectric active layers 12 (as hereinbefore described) comprising rare earth luminescent centers in a host dielectric matrix for emitting light of a first color or wavelength, and one or more second dielectric active layers 14 comprising rare earth luminescent centers in a host dielectric matrix for emitting light of a second color or wavelength. First and second dielectric drift layers 13 and 15 are disposed adjacent the first and second dielectric active layers 12 and 14, respectively. Top electrode 21 and back contact electrode 25, respectively, are provided for application of an electric field and current injection for excitation of light emission. In a representative embodiment, the active layers 12 and 14 comprise a dielectric host matrix containing the rare earth luminescent centers, e.g., rare earth doped silicon nitride containing from 1-5 at. % of a rare earth species, such as cerium, and the drift layers 13 and 15 comprise silicon dioxide. As illustrated, the multilayer light emitting device structure 200 is provided on the substrate 11, e.g., silicon, which supports the back contact electrode 25. The top electrode 21 is transparent, e.g., ITO, and has electrical contacts 23 and a protective silicon nitride layer 42 deposited thereon. The engineered structure 100 may include a reflective layer 31 between the substrate 11 and the multilayer light emitting structure 200 or between the substrate 11 and the back contact electrode 25 for reflecting generated light up through the top transparent electrode 21 to increase light extraction. Field oxide regions 28 define a device well region to confine current injection. An encapsulant 35, for example, a semi-spherical or semi-cylindrical mass of a material of a suitable refractive index, e.g., transparent epoxy, over the top electrode 21 acts as a lens to increase light extraction. For efficient impact excitation, corresponding drift layers 13 and 15, adjacent each respective active layer 12 and 14, each have a thickness related to the respective excitation energy of the adjacent active layer 12 and 14.

Deposition of each rare earth doped active layer 12 and 14 and each drift layer 13 and 15 by the chemical vapor deposition methods according to the above described embodiments, including surface treatment of the deposited silicon nitride 12 and 14 and silicon dioxide 13 and 15 layers with silane, provides for increased flatness, layer-to-layer continuity, and lateral continuity of deposited layers.

In variations of the multilayer light emitting structure 200 described above, the active layers 12 and 14 may comprise, for example, rare earth doped silicon dioxide, rare earth oxides, or other materials as disclosed in the above referenced related copending applications. The drift layers 13 and 15 may comprise, e.g., silicon dioxide or silicon nitride. Selected first and second active layers 12 and 14 may be doped with different rare earth luminescent species for emission of different colors, or active layers 12 and 14 may be co-doped with two or more different rare earth luminescent species for emission of a light of a specific CRI, e.g., white light. Active layers 12 and 14 for these and other light emitting device structures may comprise a concentration of rare earth luminescent centers from 0.1-50 at. %. Although this embodiment shows a light emitting structure 100 comprising two layer stacks 12/13 and 14/15, each with a plurality of layer pairs, alternative embodiments may comprise additional stacks of active layer/drift layer pairs comprising rare earth luminescent centers for producing light of different colors and wavelengths or for light emission of a particular CRI.

Suggested rare earth luminescent centers comprise one or more of Ce, Pr, Nd, Sm, Eu, Gd, Tb, Dy, Ho, Er, Tm, or Yb. One or more selected rare earth luminescent centers are incorporated into the reactant gas mixture for deposition of the active layers, 12 or 14, by including a suitable rare earth precursor, e.g., a metal organic precursor compound that is sufficiently volatile at the desired deposition temperature and pressure.

Examples of rare earth precursors are disclosed, for example, in U.S. Pat. No. 7,679,102, entitled "Carbon Passivation in Solid-State Light Emitters," issued to Chik et al., which is incorporated herein by reference. Suitable ligands for the rare earth element may include acetate functions, for example, 2,2,6,6-tetramethyl-3,5-heptanedione, acetylacetonate, flurolacetonate, 6,6,7,7,8,8,8-heptafluoro-2,2-dimethyl-3,5-octanedione, i-propylcyclopentadienyl, cyclopentadienyl, and n-butylcyclopentadienyl.

Typically, each active layer 12 and 14 has a thickness from 1-10 nm, although active layers 12 and 14 may be as thin as one monolayer (one atomic layer), and each drift layer 13 and 15 typically has a thickness from 2-10 nm to provide an appropriate electron excitation energy, as explained above. For electroluminescent light emitting device structures, electrodes 21 and 25 are provided for applying a suitable electric field, which may be about 5-8 MV/cm or more, for excitation of luminescent centers. Active layer/drift layer pairs 12/13 or 14/15 and electrodes 21 and 25 may be configured for operation with an AC or DC voltage.

The thickness of the drift layers 13 and 15 are determined as a function of the wavelength, and therefore of the desired excitation energy of the corresponding active layers 12 and 14. For an electric field applied perpendicular to the plane of the active layers 12 to 14, an electron should gain sufficient energy from the applied electrical field to excite the luminescent centers to the correct energy, i.e., in the ballistic regime, the energy gained in the drift layers 13 and 15 (measured in eV) is equal to the electric field multiplied by the thickness of the drift layer 12 or 14. Accordingly, the drift layers 13 adjacent active layers 12 may have a different thickness than the drift layers 15 adjacent the active layers 14. For example, for an applied electrical field of 5 MV/cm, the thickness of the drift layer 13 and 15 should be 3.8 nm or thicker to excite a luminescent center to 1.9 eV (1.9 eV/0.5 eV/nm=3.8 nm), 4.6 nm or thicker to excite a luminescent center to 2.3 eV, or 5.6 nm or thicker to excite a luminescent center to 2.8 eV. For light emitting film structures 100 powered by AC electrical power, in which neighboring active layers, e.g., 12 and 14, emit at different wavelengths, the intervening drift layer, e.g., 13, should be thick enough for excitation of the luminescent centers in the higher energy layer.

Chemical vapor deposition is one method for commercial production of such multilayer light emitting structures 200 at reasonable cost. Methods of fabrication of the multilayer light emitting structures 200 comprising multiple active layer/drift layer pairs 12/13, 14/15 according to the embodiments of the present disclosure comprising surface treatment or activation of deposited dielectric layers with the metal or semiconductor source gas, e.g., silane, overcome limitations mentioned above of thermal CVD processes and apparatus. Increased flatness of deposited dielectric layers 12 to 15 enables scalability of multilayer nano-layer dielectric structures to a larger number of layers, e.g., 24 layer pairs or more, without breakdown of the uniformity of layer structure and thickness.

As disclosed in copending U.S. Pat. No. 8,232,611, entitled "Cerium Doped Gate Oxide Layers," issued to Miner et al., high quality, thin, rare earth doped dielectric layers, particularly oxide layers, may also have applications for gate oxides and tunnel oxides in other electronic devices such as transistors, memory cells, and flash devices. Preparation of such oxides by use of silane chemistry and silane surface treatment to provide nano-layers, which are substantially atomically flat, would also be beneficial for such structures.

Other device structures where a dielectric layer, such as a layer of doped or undoped silicon dioxide, nitride, or oxynitride, or other dielectric, provides a gate oxide, tunnel oxide, capacitor dielectric, may also benefit from chemical vapor deposition with surface activation treatment, as disclosed above, to provide dielectric thin films or nano-layers with increased flatness and uniformity.

While the specific embodiments described in detail above are directed to light emitting devices, emitter structures, and electroluminescent active layers comprising rare earth doped silicon dioxide or silicon nitride, it will be apparent that atomically flat, doped, or undoped thin dielectric layers of high quality potentially have a number of other uses, e.g., as gate oxides and gate layer stacks for other electronic device structures, or for gate oxides and tunnel oxides for memory and flash devices. Thin dielectric layers fabricated by methods according to embodiments of the present disclosure may comprise luminescent species, such as rare earth ions or other light emitting species, that may also find application for light emitting diodes, optically excited light emitting devices, lasers, optical modulators, and amplifiers, for example.

Chemical vapor deposition processes are provided for deposition of high quality nano-layers of dielectric materials, and particularly oxides and nitrides of silicon for light emitting device structures and other electronic devices. Low surface roughness and substantially atomically flat and abrupt layer structures provide for control of layer thicknesses and uniformity, particularly for multilayer stacks of thin film dielectrics. For light emitting device structures, increased quality and flatness of doped and undoped thin dielectric layers potentially offer increased performance, such as higher luminous efficacy, brightness, and reliability for solid-state lighting applications.

Although embodiments of the present disclosure have been described and illustrated in detail, it is to be clearly understood that the same is by way of illustration and example only and not to be taken by way of limitation, the scope of the present disclosure being limited only by the appended claims.

The invention claimed is:

1. A method of fabricating a thin film dielectric structure for a semiconductor device, the method comprising:
 depositing a first layer on a substrate, wherein the first layer includes a first dielectric material that comprises a dielectric compound of a metal or semiconductor, wherein said depositing a first layer comprises depositing the first layer from a flow of a reactant gas mixture, wherein the flow of the reactant gas mixture includes a flow of a first reactant source gas and a flow of a second reactant source gas, and wherein the reactant gas mixture comprises more of the second reactant source gas than the first reactant source gas during said depositing a first layer; and surface treating the first layer with the flow of the reactant gas mixture, wherein said surface treating comprises reducing the flow of the second reactant source gas and continuing flow of the first reactant source gas such that the reactant gas mixture comprises more of the first reactant source gas than the second reactant source gas during at least a portion of said surface treating.

2. The method of claim 1, wherein the first reactant source gas is a source of the metal or semiconductor.

3. The method of claim 2, wherein said surface treating further comprises exposing the first layer to the first reactant source gas of the metal or semiconductor for a duration to cause surface activation without causing deposition of a surface layer of amorphous or polycrystalline metal or semiconductor material.

4. The method of claim 2, wherein said surface treating further comprises flowing the first reactant source gas for a specific period of time to form a monolayer of reactive species on a surface of the first layer.

5. The method of claim 2, wherein the reactant gas mixture is a first reactant gas mixture, the method further comprising:
depositing a second layer on the first layer from a flow of a second reactant gas mixture, wherein the second layer includes a second dielectric material, wherein the second reactant gas mixture includes the first reactant source gas and a third reactant source gas, and wherein the second reactant gas mixture comprises more of the third reactant source gas than the first reactant source gas during said depositing a second layer; and
surface treating the second layer with a flow of the second reactant gas mixture, wherein said surface treating the second layer comprises reducing the flow of the third reactant source gas and continuing flow of the first reactant source gas such that the second reactant gas mixture comprises more of the first reactant source gas than the third reactant source gas during at least a portion of said surface treating the second layer.

6. The method of claim 5, further comprising depositing a plurality of layer pairs, wherein each of the plurality of layer pairs includes one of the first layers and one of the second layers, and wherein surface treatment is conducted after deposition of each first and second layer of one of the plurality of layer pairs before deposition of a subsequent one of the plurality of layer pairs.

7. The method of claim 5, wherein:
the first and second layers comprise active layers and drift layers, respectively, of a light-emitting structure; and
said depositing the first layer further comprises depositing the active layers from a third reactant gas mixture including a precursor source gas for doping of the first layer with rare earth luminescent centers.

8. The method of claim 7, wherein:
the active layers include rare earth doped silicon nitride; and
said depositing the second layer further comprises depositing the drift layers, wherein the drift layers include silicon dioxide.

9. The method of claim 1, wherein:
the first dielectric material comprises an oxide, a nitride, or an oxynitride of the metal or semiconductor;
the second reactant source gas is selected from the group consisting of an oxidation source gas and a nitridation source gas; and
reducing the flow of the second reactant source gas comprises terminating the flow of the second reactant source gas to expose the first layer to the first reactant source gas for surface activation of the first layer.

10. The method of claim 1, wherein:
the first dielectric material comprises a silicon-containing dielectric material; and
said surface treating the first layer further comprises exposing a surface of the first layer to a silicon source gas.

11. The method of claim 10, wherein the silicon source gas comprises silane.

12. The method of claim 1, wherein:
the first layer comprises an active layer of a light-emitting structure including luminescent centers; and
said depositing the first layer further comprises depositing the first layer from a third reactant gas mixture including a precursor source gas for the luminescent centers.

13. The method of claim 1, wherein the first layer comprises doped or undoped oxides, nitrides, or oxynitrides of a metal or semiconductor compatible with a silicon process.

14. A method of depositing a thin film dielectric stack, the method comprising:
providing a substrate;
depositing a first dielectric layer of a first desired thickness by exposing the substrate to a first reactant gas mixture, wherein the first reactant gas mixture includes a silicon source gas and at least one of a nitridation source gas or an oxidation source gas;
surface treating the first dielectric layer by exposing the first dielectric layer to the silicon source gas;
depositing a second dielectric layer of a second desired thickness by exposing the surface-treated first dielectric layer to a second reactant gas mixture, wherein the second reactant gas mixture includes a mixture of the silicon source gas and the at least one of the nitridation source gas or the oxidation source gas; and
surface treating the second dielectric layer by exposing the second dielectric layer to the silicon source gas.

15. The method of claim 14, further comprising repeating said depositing of a first dielectric layer, said surface treating the first dielectric layer, said depositing a second dielectric layer, and said surface treating the second dielectric layer in sequence to provide a plurality of first and second dielectric layer pairs.

16. The method of claim 14, wherein each of said surface treating the first dielectric layer and surface treating the second dielectric layer further comprises exposing the first or second dielectric layer to the silicon source gas for a specific duration to cause surface activation without causing deposition of a surface layer of amorphous or polycrystalline silicon.

17. The method of claim 14, wherein each of the first and second dielectric layers is a substantially atomically flat layer having a surface roughness less than 0.21 nm.

18. The method of claim 14, wherein at least one of the first and second dielectric layers comprises a rare earth dopant.

19. The method of claim 18, wherein the first reactant gas mixture comprises a rare earth precursor.

20. The method of claim 14, wherein each of the first and second dielectric layers comprises a material selected from the group consisting of doped and undoped oxides, nitrides, and oxynitrides of silicon.

21. The method of claim 14, wherein each of the first and second dielectric layers is deposited with a thickness in a range from 1 monolayer to about 10 nm.

* * * * *